US011853657B2

(12) United States Patent
Owen

(10) Patent No.: US 11,853,657 B2
(45) Date of Patent: Dec. 26, 2023

(54) MACHINE-LEARNED MODEL SELECTION NETWORK PLANNING

(71) Applicant: Kalibrate Technologies Limited, Manchester (GB)

(72) Inventor: Gareth Owen, Saddlesworth (GB)

(73) Assignee: Kalibrate Technologies Limited, Manchester (GB)

( * ) Notice: Subject to any disclaimer, the term of this patent is extended or adjusted under 35 U.S.C. 154(b) by 1279 days.

(21) Appl. No.: 16/288,292

(22) Filed: Feb. 28, 2019

(65) Prior Publication Data

US 2020/0279025 A1 Sep. 3, 2020

(51) Int. Cl.
| | | |
|---|---|---|
| *G06Q 30/00* | (2023.01) | |
| *G06F 30/20* | (2020.01) | |
| *G06N 20/00* | (2019.01) | |
| *G06Q 30/0202* | (2023.01) | |
| *G06N 3/08* | (2023.01) | |
| *G06Q 10/04* | (2023.01) | |

(52) U.S. Cl.
CPC .............. *G06F 30/20* (2020.01); *G06N 3/08* (2013.01); *G06N 20/00* (2019.01); *G06Q 10/04* (2013.01); *G06Q 30/0202* (2013.01)

(58) Field of Classification Search
None
See application file for complete search history.

(56) References Cited

U.S. PATENT DOCUMENTS

| | | | |
|---|---|---|---|
| 6,072,248 A | 6/2000 | Muise et al. | |
| 7,108,178 B1 | 9/2006 | Choi | |
| 8,370,280 B1 | 2/2013 | Lin et al. | |
| 8,812,417 B2 | 8/2014 | Martinez et al. | |
| 9,129,219 B1 | 9/2015 | Robertson et al. | |
| 9,489,630 B2 | 11/2016 | Achin et al. | |
| 9,697,469 B2 | 7/2017 | McMahon et al. | |

(Continued)

FOREIGN PATENT DOCUMENTS

WO 2014075108 A2 5/2014

OTHER PUBLICATIONS

Ashvin Kochak, et al., "Demand Forecasting Using Neural Network for Supply Chain Management", International Journal of Mechanical Engineering and Robotics Research, vol. 4, No. I, Jan. 2015, pp. 96-104.

(Continued)

*Primary Examiner* — Matthew T Sittner
(74) *Attorney, Agent, or Firm* — Michael Best & Friedrich LLP

(57) ABSTRACT

Methods and systems for data modelling. One method includes receiving a plurality of data points representing training data, and generating a plurality of models based on the training data, each of the plurality of models using at least one a different modelling methodology or a different portion of the training data. The method also includes receiving an input representing a requested prediction, generating an output based on the input using each of the plurality of models, providing the output generated by each of the plurality of models and the training data to a machine learning algorithm, generating, with the machine learning algorithm, the requested prediction using the output generated by each of the plurality of models and the training data, and outputting the requested prediction for display to a user.

19 Claims, 3 Drawing Sheets

(56) References Cited

U.S. PATENT DOCUMENTS

| | | |
|---|---|---|
| 2007/0078748 A1 | 4/2007 | Creed et al. |
| 2008/0208699 A1* | 8/2008 | Tsunasawa ............... G07F 9/026 705/21 |
| 2013/0091046 A1 | 4/2013 | Benbrahim |
| 2014/0115602 A1 | 4/2014 | Colligan et al. |
| 2014/0324532 A1 | 10/2014 | Ghosh et al. |
| 2014/0351011 A1 | 11/2014 | Wang et al. |
| 2015/0081491 A1 | 3/2015 | Brereton et al. |
| 2015/0134413 A1 | 5/2015 | Deshpande et al. |
| 2015/0170049 A1* | 6/2015 | Mann ....................... G06N 5/04 706/12 |
| 2016/0055426 A1* | 2/2016 | Aminzadeh ............ G06N 20/00 706/12 |
| 2016/0358661 A1* | 12/2016 | Vali ......................... G11C 16/26 |
| 2018/0204233 A1 | 7/2018 | Binkiewicz et al. |
| 2018/0253759 A1* | 9/2018 | Deng ................. G06Q 30/0243 |
| 2018/0308030 A1* | 10/2018 | Nemati ............ G06Q 10/06314 |
| 2019/0005115 A1* | 1/2019 | Warrier .................. G16H 50/70 |
| 2020/0125942 A1* | 4/2020 | Pham ...................... G06N 3/084 |
| 2020/0201532 A1* | 6/2020 | Livingston .......... G06F 3/04886 |
| 2020/0233893 A1* | 7/2020 | He ........................ G06F 16/435 |
| 2020/0279212 A1 | 9/2020 | Kubota et al. |

OTHER PUBLICATIONS

Irem Islek, "A Decision Support System for Demand Forecasting based on Classifier Ensemble", Communication papers of the Federated Conference on Computer Science and Information Systems, 2017, pp. 35-41, vol. 13.

International Search Report with Written Opinion for related Application No. PCT/GB2019/053573 dated Mar. 4, 2020 (12 pages).

Office Action issued from the United States Patent Office for related U.S. Appl. No. 16/223,717 dated Sep. 21, 2020 (14 Pages).

International Search Report and Written Opinion for Application No. PCT/GB2020/050453 dated Apr. 3, 2020 (13 pages).

Office Action issued from the US Patent Office for related U.S. Appl. No. 16/223,717 dated Jun. 4, 2021 (17 Pages).

* cited by examiner

MACHINE-LEARNED MODEL SELECTION NETWORK PLANNING

TECHNICAL FIELD

Embodiments described herein relate to systems and methods for performing network planning and, in particular, relate to using machine learning to select a model for performing network planning.

SUMMARY

Retail location and retail services provided at a location have observable impact on sales. Hence, forecasting of sales can be achieved using retail attributes, such as, for example, location, physical store attributes, and its operations.

These components that impact sales exhibit different trends in different markets and geography. Therefore, a single model falls short to capture sales relationships for different markets or geographies. Furthermore, locations with low sales act differently than locations with high sales, which introduces significant differences even in the same market and, thus, poor sales forecasting results using a single model.

One way to accurately forecast sales in such a highly complicated scenario includes re-structuring and re-defining the problem according to sub-problem states (e.g. different variables that act as drivers for sales in different markets). For example, some methods for dealing with this complexity problem is to (1) build a single, complex model that attempts to capture all variables or (2) group data by some method and build a separate model for each data group.

With respect to option (1), deep learning or similar machine learning techniques can be used to build a single, complex model. In some embodiments, multiple modelling methodologies may be employed, and the model showing the best overall performance can be used. However, these methods are extremely data hungry and must be very carefully tuned to avoid pitfalls such as over-fitting.

With respect to option (2), data can be grouped (e.g., using automatic clustering algorithms or via an analyst performing quadrant analysis) and used to build separate models. Similar to option (1), in some embodiments, multiple model methodologies may be used for each group and the best performing model can be selected for each group. One drawback of this option is that the grouping of data reduces the training sample for each model. In addition, when making predictions for a "what-if" simulation and a data point moves from one group to another group, the model used to make predictions changes, which can cause an implausible jump in predictions.

Accordingly, based on these and other problems, embodiments described herein provide an innovative decision support solution process that efficiently and intelligently processes retail data to estimate sales. As described below, these embodiments use a layered machine-learning approach to produce planning projections.

For example, one embodiment provides a method of data modelling. The method includes receiving a plurality of data points representing training data and generating a plurality of models based on the training data, each of the plurality of models using at least one a different modelling methodology or a different portion of the training data. The method also includes receiving an input representing a requested prediction, generating, with an electronic processor, an output based on the input using each of the plurality of models, providing the output generated by each of the plurality of models and the training data to a machine learning algorithm, generating, with the machine learning algorithm, the requested prediction using the output generated by each of the plurality of models and the training data, and outputting the requested prediction for display to a user.

Another embodiment provides a system for performing data modelling. The system includes at least one electronic processor. The at least one electronic processor is configured to receive a plurality of data points representing training data and generate a plurality of models based on the training data, each of the plurality of models using at least one a different modelling methodology or a different portion of the training data. The at least one electronic processor is also configured to receive an input representing a requested prediction, generate an output based on the input using each of the plurality of models, provide the output generated by each of the plurality of models and the training data to a machine learning algorithm, generate the requested prediction using the output generated by each of the plurality of models and the training data, and output the requested prediction.

Yet a further embodiment provides non-transitory, computer-readable medium storing instructions, that when executed by an electronic processor, perform a set of functions. The set of functions includes receiving a plurality of data points representing training data and generating a plurality of models based on the training data, each of the plurality of models using at least one a different modelling methodology or a different portion of the training data. The set of functions further includes receiving an input representing a requested prediction, generating an output based on the input using each of the plurality of models, providing the output generated by each of the plurality of models and the training data to a machine learning algorithm, generating, with the machine learning algorithm, the requested prediction using the output generated by each of the plurality of models and the training data, and outputting the requested prediction.

BRIEF DESCRIPTION OF THE DRAWINGS

Embodiments will now be described, by way of example, with reference to the accompanying drawings, in which.

DETAILED DESCRIPTION

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Figure 1:
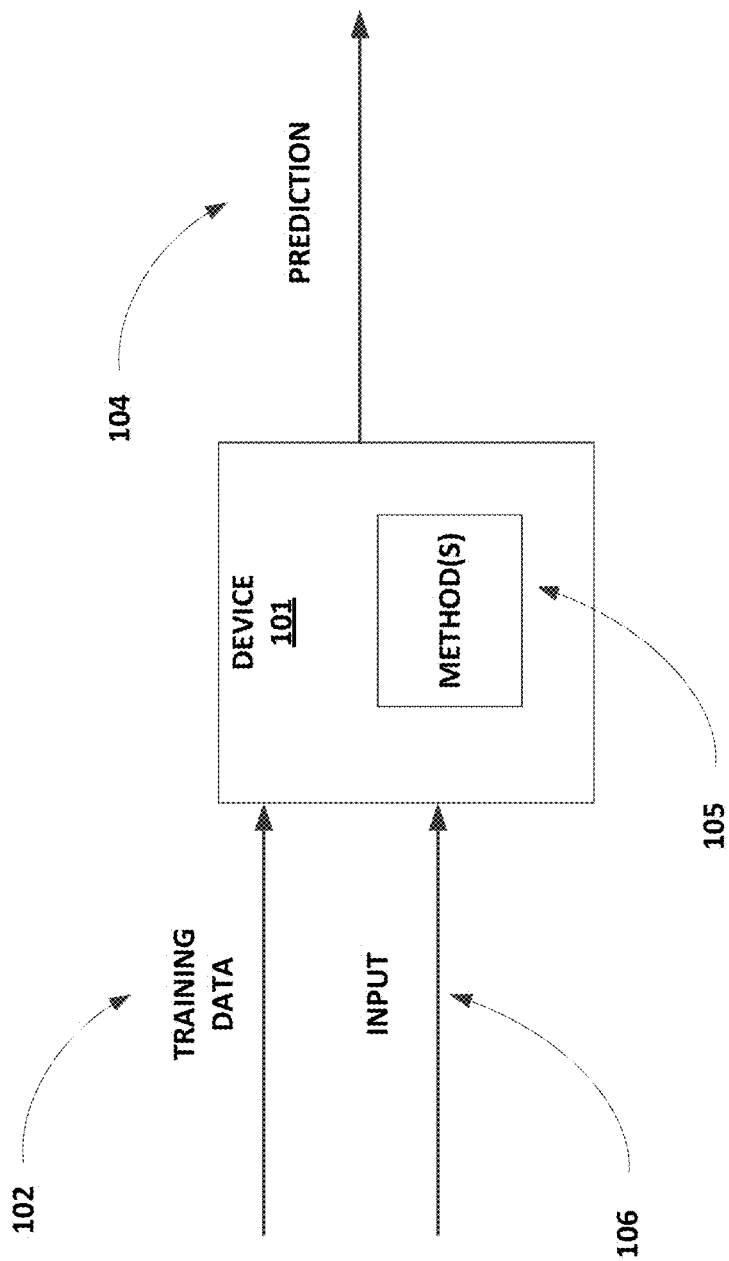
FIG. 1 is a schematic illustration of a system according to an embodiment.

FIG. 1 is a schematic illustration of a system 100 according to one embodiment for providing network planning. As illustrated in FIG. 1, the system 100 includes a device 101 arranged to receive data 102 from one or more data sources. The device 101 may be any type of computing device, for example, a server, a personal computer, a laptop, a smartphone, a tablet, or other suitable processing device. The device 101 may receive the data 102 from a second device (not shown in FIG. 1), which may be another computing device, a sensor, or the like. One or more intermediary devices may also exist between the second device (the source of the data 102 or a portion thereof) and the device 101. In some embodiments, the device 101 receives the data 102 through one or more wired or wireless connections, such as a network such as the Internet. In other embodiments, the device 101 receives the data 102 through a local transfer, for example, via a universal serial bus (USB) port of the device 101.

The data 102 includes training data for generating models as described in more detail below. The data 102 may be any type of data. For example, the data 102 may be temporal or sequential data such as video data, audio data, image data, sensor data, an electronic document, financial data such as pricing and sales data, or any other type of suitable data recorded at various frequencies (a static frequency or a varying frequency). In some embodiments, the data 102 includes (i) the sales data for one or more locations, which fulfils the role of the dependent variable (i.e., the variable which is to be predicted) and (ii) non-sales data, which describes the attributes of the location associated with the sales data (site). These attributes might describe the location facility itself (e.g., the layout of the site, the number of pump positions, weekend and weekday opening hours, whether or not the site has a convenience store and the dimensions and inventory of that store, price of regular gasoline, and the like). Alternatively, these attributes might describe the environment surrounding the sites (e.g., traffic levels, demographic breakdown of inhabitants and people who work in the area, average traffic speed, crime levels, or the like). These attributes may be considered static (invariant), updated on timescales from very low frequency (e.g., demographic data from surveys and censuses) to real-time or approximately real-time (e.g., price information, traffic data extracted from cameras, crowd sourced information about site facilities, connected vehicle telemetry, etc.), or a combination thereof. The data 102 may include a stream of data provided in approximately real-time or data collected and stored in a memory device. The device 101 may request the data 102 from one or more data sources, one or more data sources may be configured to push the data 102 to the device 101, or a combination thereof.

As described in more detail below, the device 101 is configured to process the data 102 to generate models (105), which are used to forecast data (generate a prediction 104), such as sales, based on input 106, such as a retail location.

Figure 2:
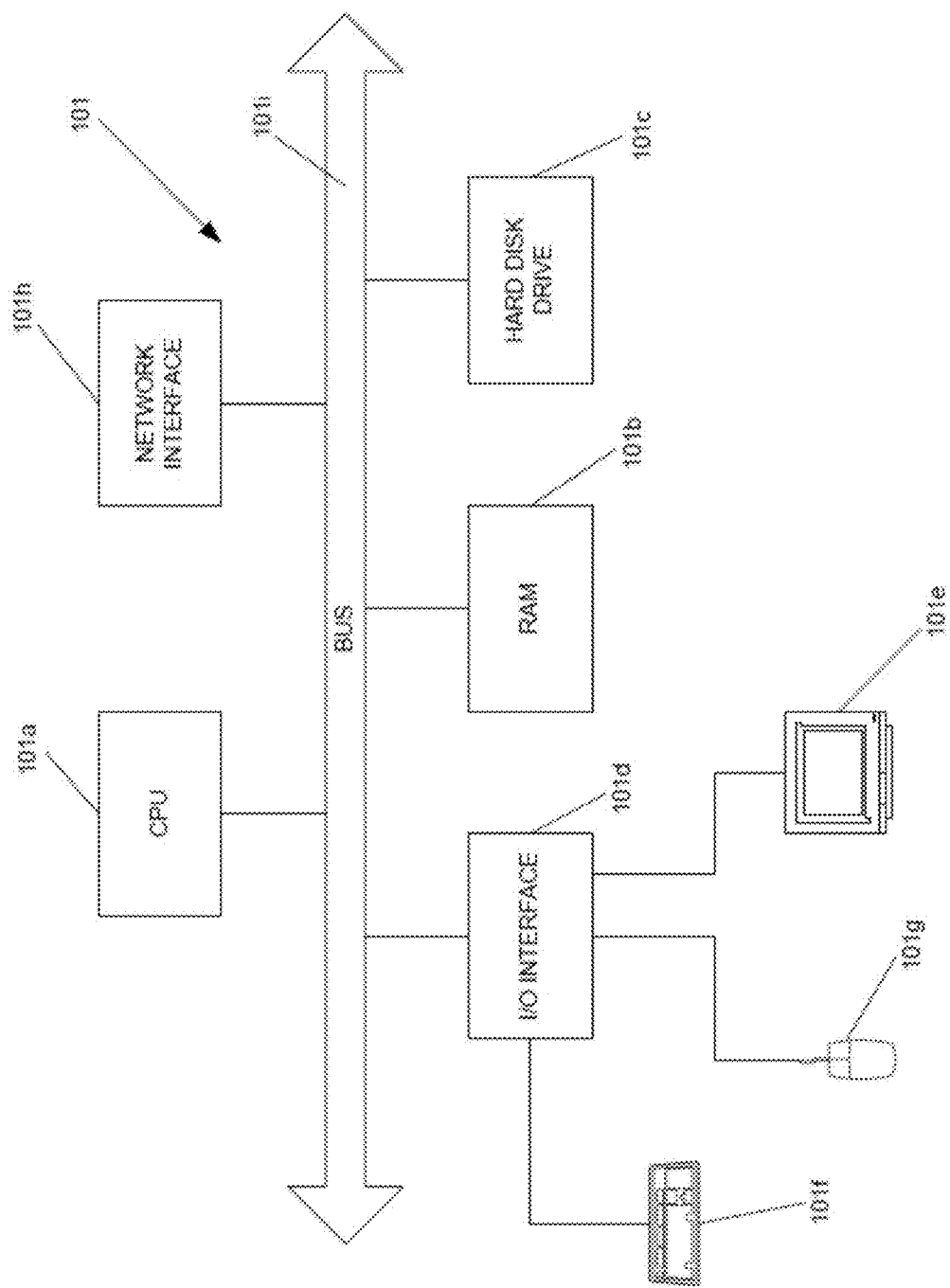
FIG. 2 is a schematic illustration of a device of the system of FIG. 1 in more detail according to an embodiment.

FIG. 2 illustrates the device 101 of FIG. 1 in further detail. As illustrated in FIG. 2, the device 101 comprises an electronic processor 101a (for example, a central processing unit (CPU) that is configured to read and execute instructions stored in a volatile memory 101b, which can take the form of a random access memory. The volatile memory 101b includes non-transitory computer-readable medium and stores instructions for execution by the electronic processor 101a and data used by those instructions. For example, in use, the data 102 may be stored in volatile memory 101b.

The device 101 further comprises non-volatile storage, such as a hard disc drive 101c. In some embodiments, the data 102 is stored on the hard disc drive 101c. As illustrated in FIG. 2, the device 101 further comprises an input/output (I/O) interface 101d to which are connected peripheral devices used in connection with the device 101. For example, the device 101 may communicate (through the I/O interface 101d) with a display 101e configured to display output from the device 101. In some embodiments, the device 101 also communicates (through the I/O interface 101d) with one or more input devices. Such input devices may include a keyboard 101f, a mouse 101g, or the like, which allow interaction with the device 101. The one or more input devices may also include a port for receiving a memory device, such as a USB port. A network interface 101h also allows the device 101 to be connected to an appropriate computer network so as to receive and transmit data from and to other computing devices. For example, in some embodiments, the device 101 receives the data 102 as described above over the network interface 101h. In some embodiments, as illustrated in FIG. 2, the electronic processor 101a, the memory 101b, the I/O interface 101d, and network interface 101h communicate via a bus 101i. It should be understood that the device 101 may include different or additional components than those illustrated in FIG. 2 in various configuration. Also, in some embodiments, the functionality described herein as being performed by the device 101 may be performed in a distributed nature using a plurality of devices (such as a cloud environment or distributing computing environment), each of which may include similar components as the device 101 as described herein.

The device 101 (the electronic processor 101a) executes instructions stored in the memory 101b to perform various functions, including the functions described herein. For example, FIG. 3 is a flow chart illustrating processing performed by the device 101, including the generation of a forecasting model.

As described above, existing methodologies for modelling complex relationships typically either build a single complex model or a small number of simpler models and either of these methodologies may rely on a set of model selection criteria. As noted above, both of these methodologies suffer from numerous deficiencies, including data requirements or deficiencies (e.g., requiring large amounts of data or limiting an amount of training data available when creating models or small groups of training data) as well as computing resources requirements. Accordingly, rather than build a single complex model or a small number of simpler models, embodiments described herein build a multiplicity of models of the entire dataset. The models are built using multiple methodologies, using different subsets of the training data, using different subspaces of the training data, using a transformed version of at least some of the training data, or a combination thereof. However, rather than using a selection criterion (either automatic or manual) to choose the "best" model for a particular prediction, the outputs of each of these models, appended to the training data, are passed to an additional machine learning algorithm that produces a final prediction. The second algorithm, stacked on to the multiple models beneath, will, in effect, learn the regions of the input data in which each of the original models is most accurate. This gives the advantages of the clustering approach (selecting models tuned to a certain group of inputs) but with additional advantages. In particular, no explicit model selection takes place and so no selection criteria needs to be developed, which may eliminate the need for an analyst to establish this criteria. In addition, as well as accurately modelling any underlying clusters in the data, the new approach also smoothly models the transition between the clusters. Accordingly, there is no threshold point at which the selected model switches abruptly and no risk of discontinuity in output if a continuous range of "what-if" scenarios are tested.

Figure 3:
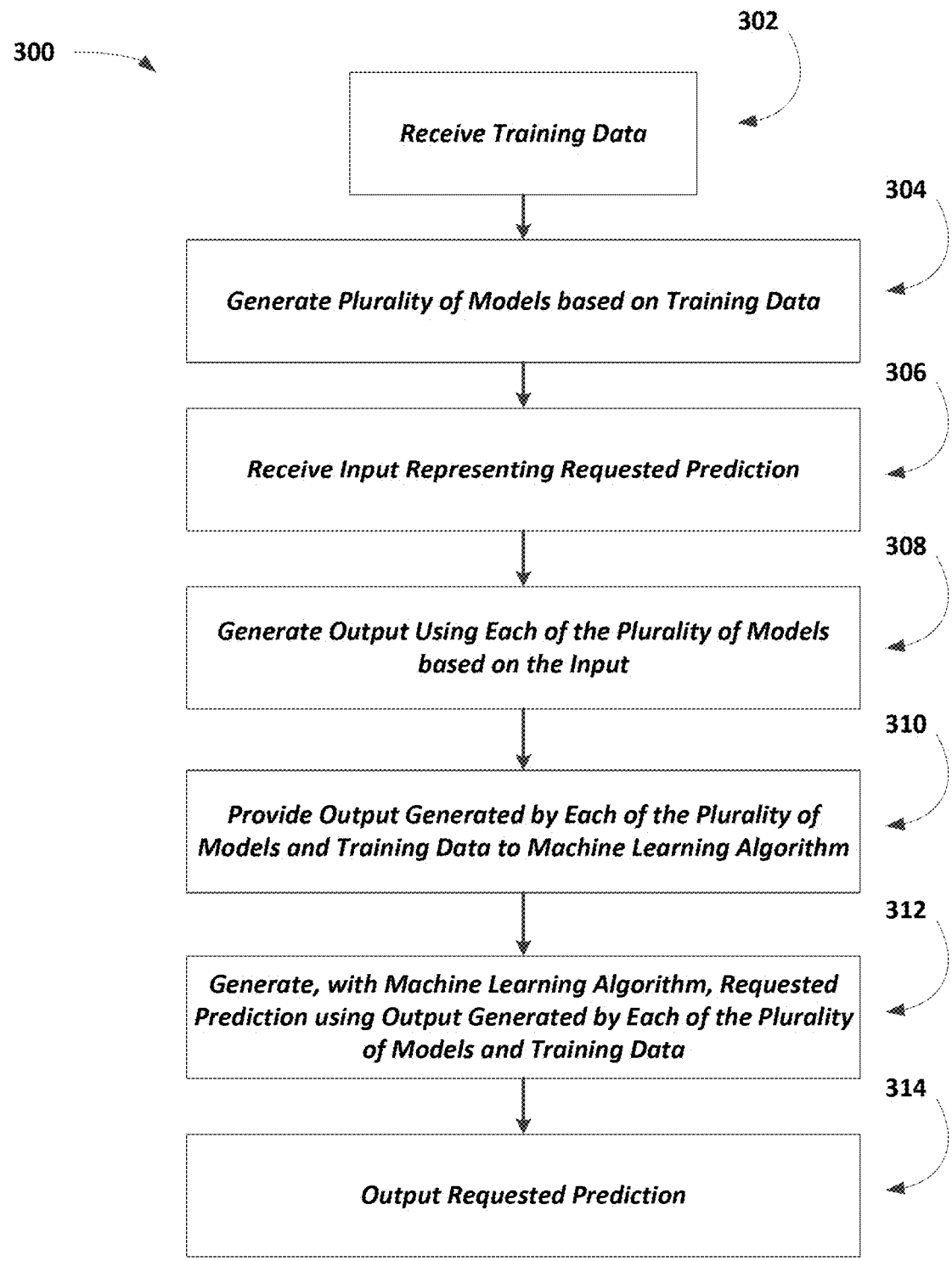
FIG. 3 is a flowchart showing processing performed by the device of FIG. 2.

For example, as illustrated in FIG. 3, the device 101 performs a method 300 including data modelling. It should be understood that although the method 300 is described herein as being performed by the device 101, this is provided as one example configuration and in other embodiments, the device 101 may perform only a subset of functionality of method 300 or this functionality may be performed in a distributed nature by a number of devices.

As illustrated in FIG. 3, the method 300 includes receiving data including a plurality of data points representing training data (at block 302). As noted above, the data 102 includes training data for generating models and can include any type of data. However, in some embodiments, the training data includes a plurality of data points, wherein each data point includes (i) sales data for a location, which fulfils the role of the dependent variable (i.e., the variable which is to be predicted) and (ii) non-sales data, which describes the attributes of the location (site).

As illustrated in FIG. 3, the method 300 also includes generating a plurality of models based on the plurality of data points (at block 304). Each of the plurality of models uses at least one a different modelling methodology or different training data. For example, in some embodiments, each of the plurality of models is generated using at least one selected from a group consisting of the plurality of data points, a subset of the plurality, a subspace of the plurality of data points, and a transformed version of at least a portion of the plurality of data points. A subset of the plurality of data points is created by removing entire observations (i.e., sales data for an individual site or a multiplicity of sites) from the dataset. A subspace, in contrast, uses all the sites in the dataset, but either omits at least one of the attributes for each of the sites or otherwise uses feature selection to reduce the dimension of the dataset. For example, if the dataset (the plurality of data points) is represented as a table, taking a subset would involve choosing to use only certain rows of the table and taking a subspace would involve using all the rows, but removing some of the columns.

In some embodiments, the training data is portioned (e.g., subsetted) as part of creating the plurality of models using random sampling. An ensemble of models built using random subsamples of the full datasets will usually be less prone to overfitting that a single model built using the full dataset. Alternatively or in addition, in some embodiments, subsets of the dataset are generated using a structured method, such as, for example, the process known as Boosting. Boosting builds a set of models where every new model is built using training data that was (in some sense) poorly predicted by the previous models. The training data may similarly be subspace using various methods, including random selection of attributes (columns) from the full dataset (such an approach is intrinsic to how a random forest is built). In general, the methods used to subset or subspace the dataset may vary from the relatively simple techniques to detect and remove redundancy (such as stepwise regression or correlation analysis between attributes) to more complex methods for dimension reduction, such as principal component analysis/factor analysis (in which the co-ordinates are rotated onto a lower dimensional space that capture the maximum variability in the data), independent component analysis (in which basis vectors are generated in which the original dataset has a distribution which is in some sense "interesting") and non-negative matrix factorisation (in which the data is factorised so that every observation is expressed as the sum of a small number of "signals").

With respect to the modelling methodologies used to create the plurality of models, almost any type of machine learning algorithm could be used. For example, in some embodiments, the plurality of models includes one or more models created using a multilayer perceptron neural net, kernel support vector regression, regularized linear regression (i.e., ridge regression, LASSO regression or elastic net regression), partial least-squares regression, principal component regression, or regression trees or random forests.

As illustrated in FIG. 3, the method 300 also includes receiving an input representing a requested prediction (at block 306) and generating an output based on the input using each of the plurality of models (at block 308). The input represents the requested prediction and, in some embodiments, is in the same format as used for training the created plurality of models.

In some embodiments, the input may represent a hypothetical modification to an existing site (e.g., to answer a question like "how would the volume achieved at Site X be altered if the gasoline price were lowered by 2 cents per gallon and the number of pumps were increased from 3 to 4?"). Alternatively, the input may be facility parameters for an extant site, but geographically located elsewhere (thus, with different demographic and traffic data) (e.g., "How would a fuel station with the same attributes as Site X perform, if were located in neighbourhood Y, at the junction of two busy streets?"). Regardless of the format of the input, in some embodiments, the output generated by each of the plurality of models includes a predicted sales volume based on the hypothesised site attributes.

The output generated by each of the plurality of models and the training data is then provided to a machine learning algorithm (at block 310). This machine learning algorithm is referred to herein as the second-level model as compared to the first-level models created based on the original training data (at block 304). Accordingly, the second-level model is trained using the outputs from the first-level models. In some embodiments, the second-level model is trained using the outputs from the first-level model without any metadata about the methodologies or datasets used to create the first-level model.

The second-level model can be developed using any type of machine learning algorithm. However, in some embodiments, the machine learning used is non-linear in the inputs, as otherwise the second stage reduces to a simple weighted average of the inputs. In some embodiments, this algorithm is trained using half of the original training dataset. For example, in some embodiments, the initial training set is split into two disjoint sets of data (set A and set B). These two datasets may of (nearly) equal size. Set A is used to train each of the plurality of first-level models. These models are then used to predict volumes for the sites in Set B, and these outputs are used to train the second-level model. In some embodiments, parameter selection and the like is carried out using a suitable cross-validation procedure.

The machine learning algorithm generates the requested prediction using the output generated by each of the plurality of models and the training data (at block 312) and, in some embodiments, the requested prediction is output for display to a user (at block 314). The output can be provided in various ways, formats, and configurations. For example, in some embodiments, the output is displayed on a map displaying the sites local to any sites that have been modelled with the change in predicted volumes induced by the changes in site attributes.

In some embodiments, the output can also be fed to other systems for further processing and/or use. For example, in some embodiments, the output can be used by additional algorithm by which any increase/decrease in projected volume at a site is reflected by a corresponding decrease/increase in sales volumes at sites within a pre-determined catchment area. In this example, the total demand for fuel within a local area remains constant.

The stacked machine learning algorithms can also adapted for online learning. For example, when the learning algorithms used for the first-level and second-level models are capable of online-learning, then as new observations are made, the observations can be used for training the first-level and second-level models, in a method analogous to Set A and Set B described above. This type of online learning may be particularly useful when observations may occur on a short timescale, such as observations that may occur at microsecond or nanosecond intervals.

The output provided by the stacked model produced by the method 300 described above has advantages over outputs produced using other techniques, including the clustered approach described above. In particular, as noted above, the stacked model produces continuously-varying output and also can make use of the entire training data set unlike clustering approaches. Furthermore, the stacked model produced by the method 300 described above has advantages over single, complex models. As noted above, a single complex model typically requires considerably more data to produce comparable results to the stacked model approach. Thus, the stacked model described in the present application reduces the need to collect and store large quantities of data to ensure good model performance and, thus, provides efficiency savings. In addition, many complex model types—such as a deep learning network or a support vector machine—require training times that scale super-linearly with the size of the data. This is exacerbated by the need to perform repeated model build cross-validation to determine the set of meta-parameters or the network topology that produces optimal model performance. In contrast, although the stacked approach includes the construction of a plurality of sub-models, these sub-models are trained using substantially fewer data points, and the training algorithms for the sub-models will be less computationally expensive (e.g., even a neural network sub-model tends to have a simple topology, as compared to a full deep-learning model). Accordingly, both these factors lead to a more computationally efficient modelling procedure.

Although embodiments have been described herein in terms of generating sales predictions, the systems and methods described herein are not limited to this context or purpose. Rather, the systems and methods described herein can be used to generate predictions for any type using the disclosed stacked model.

Furthermore, although specific embodiments of the invention have been described above, it will be appreciated that various modifications can be made to the described embodiments without departing from the spirit and scope of the present invention. That is, the described embodiments are to be considered in all respects exemplary and non-limiting. In particular, where a particular form has been described for particular processing, it will be appreciated that such processing may be carried out in any suitable form arranged to provide suitable output data.

What is claimed is:
1. A method of data modelling, the method comprising:
receiving, with one or more electronic processors from one or more data sources over one or more wired or wireless connection, a plurality of data points representing training data;
creating, with the one or more electronic processors, a training set for each of a plurality of models based on the training data, the plurality of models representing first-level models;
training, with the one or more electronic processors, each of the first-level models with the respective training set , each of the first-level models using at least one a different modelling methodology or trained using a different portion of the training data;
receiving, with the one or more electronic processors, an input representing a requested prediction;
generating, with the one or more electronic processors, the requested prediction based on the input by feeding the input to both the first-level models and a second-level model, wherein generating the requested prediction includes:
generating, with the one or more electronic processors, an output based on the input using each of the first-level models, as trained;
providing the output generated by each of the first-level models and the training data to a machine learning algorithm representing the second-level model;

training, with the one or more electronic processors, the second-level model with the output generated by each of the first-level models and at least a portion of the training data;

generating, with the one or more electronic processors executing the second-level model, as trained, the requested prediction based on the input; and outputting, with the one or more electronic processors, the requested prediction to a display communicatively coupled with the one or more electronic processors, for display to a user.

2. The method of claim 1, wherein training each of the first-level models includes training each of the first-level models using at least one selected from a group consisting of the plurality of data points, a subset of the plurality of data points, a subspace of the plurality of data points, and a transformed version of at least a portion of the plurality of data points.

3. The method of claim 1, wherein receiving the plurality of data points includes receiving sales data for a site and non-sales data for the site.

4. The method of claim 3, wherein receiving the non-sales data for the site includes receiving at least one selected from a group consisting of a layout of a site, hours of the site, inventory of the site, a price of a good at the site.

5. The method of claim 3, wherein receiving the non-sales data for the site includes receiving at least one selected from a group consisting of a traffic level of the site, demographic data for an area including the site, an average traffic speed around the site, and a crime level for an area including the site.

6. The method of claim 3, wherein receiving the input includes receiving a request for predicted sales data.

7. The method of claim 1, wherein training each of the first-level models based on the training data includes defining a portion of the training data for training at least one of the first-level models using random sampling.

8. The method of claim 1, wherein training each of the first-level models based on the training data includes defining a portion of the training data for at least one of the first-level models using Boosting.

9. The method of claim 1, wherein at least one of the first-level models includes at least one selected from a group consisting of a multilayer perceptron neural net, kernel support vector regression, regularized linear regression, partial least-squares regression, principal component regression, regression trees, and random forests.

10. The method of claim 1, wherein training the second-level model includes:

splitting the training data into a first set of training data and second set of training data, wherein the first set of training data is used to train each of the first-level models;

using the first-level models, after being trained, to generate output for data included in the second set of training data; and using the second set of training data and the output from the first-level models for the data included in the second set of training data to train the second-level model.

11. The method of claim 1, wherein outputting the requested prediction includes outputting a map displaying predicted sales data induced by a change in site attributes specified by the input.

12. A system for performing data modelling, the system comprising:

at least one electronic processor configured to:

receive, from at least one data source, a plurality of data points representing training data, generate a plurality of models based on the training data, each of the plurality of models using at least one a different modelling methodology or trained using a different portion of the training data, the plurality of models representing first-level models;

receive an input representing a requested prediction, and generate the requested prediction based on the input by feeding the input to both the first-level models and a second-level model, wherein the at least one electronic processor generates the requested prediction by:

generating an output based on the input using each of the first-level models, providing the output generated by each of the first-level models and the training data to a machine learning algorithm representing the second-level model, training the second-level model with the output generated by each of the first-level models and at least a portion of the training data;

generating the requested prediction using the second-level model, as trained, based on the input, and output the requested prediction to at least one selected from a group consisting of a display and a remote computing device.

13. The system of claim 12, wherein each of the plurality of models is generated using at least one selected from a group consisting of the plurality of data points, a subset of the plurality of data points, a subspace of the plurality of data points, and a transformed version of at least a portion of the plurality of data points.

14. The system of claim 12, wherein the at least one electronic processor is configured to generate the plurality of models by defining a portion of the training data for at least one of the plurality of models using random sampling.

15. The system of claim 12, wherein the at least one electronic processor is configured to generate the plurality of models by defining a portion of the training data for at least one of the plurality of models using Boosting.

16. The system of claim 12, wherein the at least one electronic processor is configured to generate at least one of the plurality of models using at least one selected from a group consisting of a multilayer perceptron neural net, kernel support vector regression, regularized linear regression, partial least-squares regression, principal component regression, regression trees, and random forests.

17. The system of claim 12, wherein the at least one electronic processor is configured to train the second-level model by:

splitting the training data into a first set of training data and second set of training data, wherein the first set of training data is used to train each of the first-level models, using the first-level models, after being trained, to generate output for data included in the second set of training data, and using the second set of training data and the output from the first-level models for the data included in the second set of training data to train the second-level model.

18. Non-transitory, computer-readable medium storing instructions, that when executed by an electronic processor, perform a set of functions, the set of functions comprising:

receiving a plurality of data points representing training data;

splitting the training data into a first set of training data and second set of training data;

training each of a plurality of models based on the first set of training data, each of the plurality of models using at least one a different modelling methodology or trained using a different portion of the first set of training data, the plurality of models representing first-level models;

using the first-level models, after being trained, to generate output for data included in the second set of training data;

receiving an input representing a requested prediction; and generate the requested prediction to the input by feeding the input to both the first-level models and a second-level model, wherein generating the requested prediction includes:

generating an output based on the input using each of the first-level models;

training a machine learning algorithm representing the second-level model with the output generated by each of the first-level models based on the input, the second set of training data, and the output generated by each of the first- level models for the data included in the second set of training data;

generating, with the second-level model, as trained, the requested prediction based on the input; and outputting the requested prediction.

19. The non-transitory, computer-readable medium of claim 18, wherein each of the plurality of models is trained using at least one selected from a group consisting of the plurality of data points, a subset of the plurality of data points, a subspace of the plurality of data points, and a transformed version of at least a portion of the plurality of data points.

\* \* \* \* \*